United States Patent [19]

Chaney et al.

[11] Patent Number: 4,466,049
[45] Date of Patent: Aug. 14, 1984

[54] MODULAR CIRCUIT BOARD GUIDE

[75] Inventors: John W. Chaney, Sharonville, Ohio; Roger G. Royer, Madison, Ind.

[73] Assignee: Cincinnati Milacron Industries, Inc., Cincinnati, Ohio

[21] Appl. No.: 510,160

[22] Filed: Jul. 1, 1983

Related U.S. Application Data

[63] Continuation of Ser. No. 261,591, May 7, 1981, abandoned.

[51] Int. Cl.³ .............................................. H05K 7/20
[52] U.S. Cl. .................................. 361/383; 361/415; 339/17 M; 211/41; 165/80 B
[58] Field of Search .......... 339/119 R, 17 LM, 17 M, 339/17 N, 112 R; 211/41; 165/80 B, 80 D; 174/15 R, 16 R; 361/381–384, 393–396, 413, 415

[56] References Cited

U.S. PATENT DOCUMENTS

| | | | |
|---|---|---|---|
| 3,382,476 | 5/1968 | Novet | 361/415 |
| 3,567,998 | 3/1971 | Ammerman | 361/415 |
| 3,711,814 | 1/1973 | Pomella | 361/415 |
| 3,967,874 | 7/1976 | Calabro | 361/384 |
| 4,048,669 | 9/1977 | Bowler | 361/415 |
| 4,091,440 | 5/1978 | Gelin | 361/415 |
| 4,092,699 | 5/1978 | Petrangelo | 361/415 |
| 4,277,815 | 7/1981 | Skroupa | 361/383 |

*Primary Examiner*—G. P. Tolin
*Attorney, Agent, or Firm*—Thomas M. Farrell

[57] ABSTRACT

A plurality of like modules having an open sided C-frame construction are provided with slot-forming guides for receiving a plurality of circuit boards which are inserted from the open side. The circuit boards, when fully received in the guide slot, are engageable with electrical connectorings on the main body section of the C-frame. A plenum chamber is formed on the bottommost surface of the plurality of C-frame modules, and vent slots are provided through the modules at the upper and lower limbs of the C-frame, thereby permitting air to be ducted through the plenum chamber and convected up through the vent slots, thereby dissipating heat from the circuit boards. Means is provided for connecting the plurality of modules in a predetermined fashion to one another, to form a rigid assembly.

5 Claims, 9 Drawing Figures

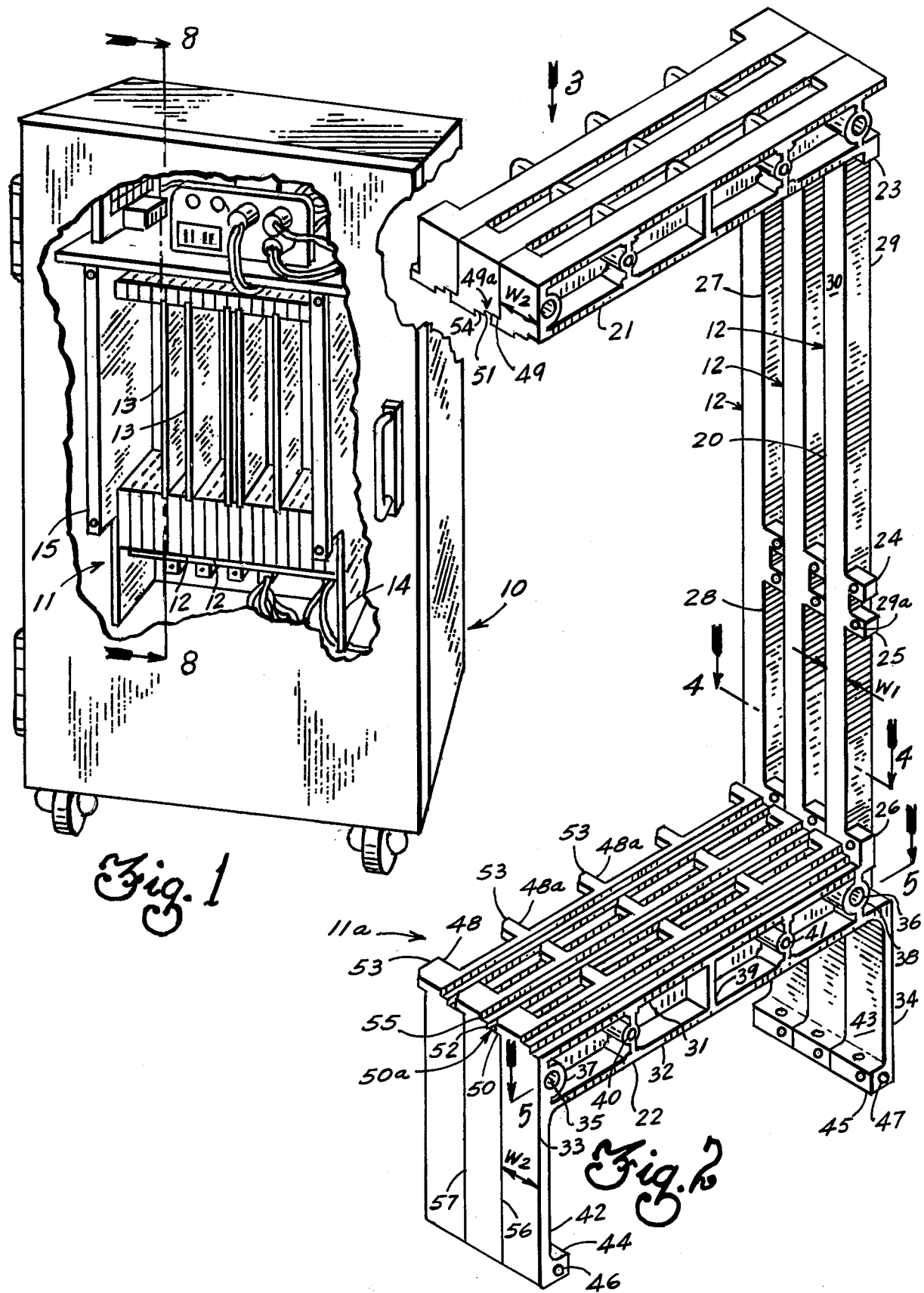

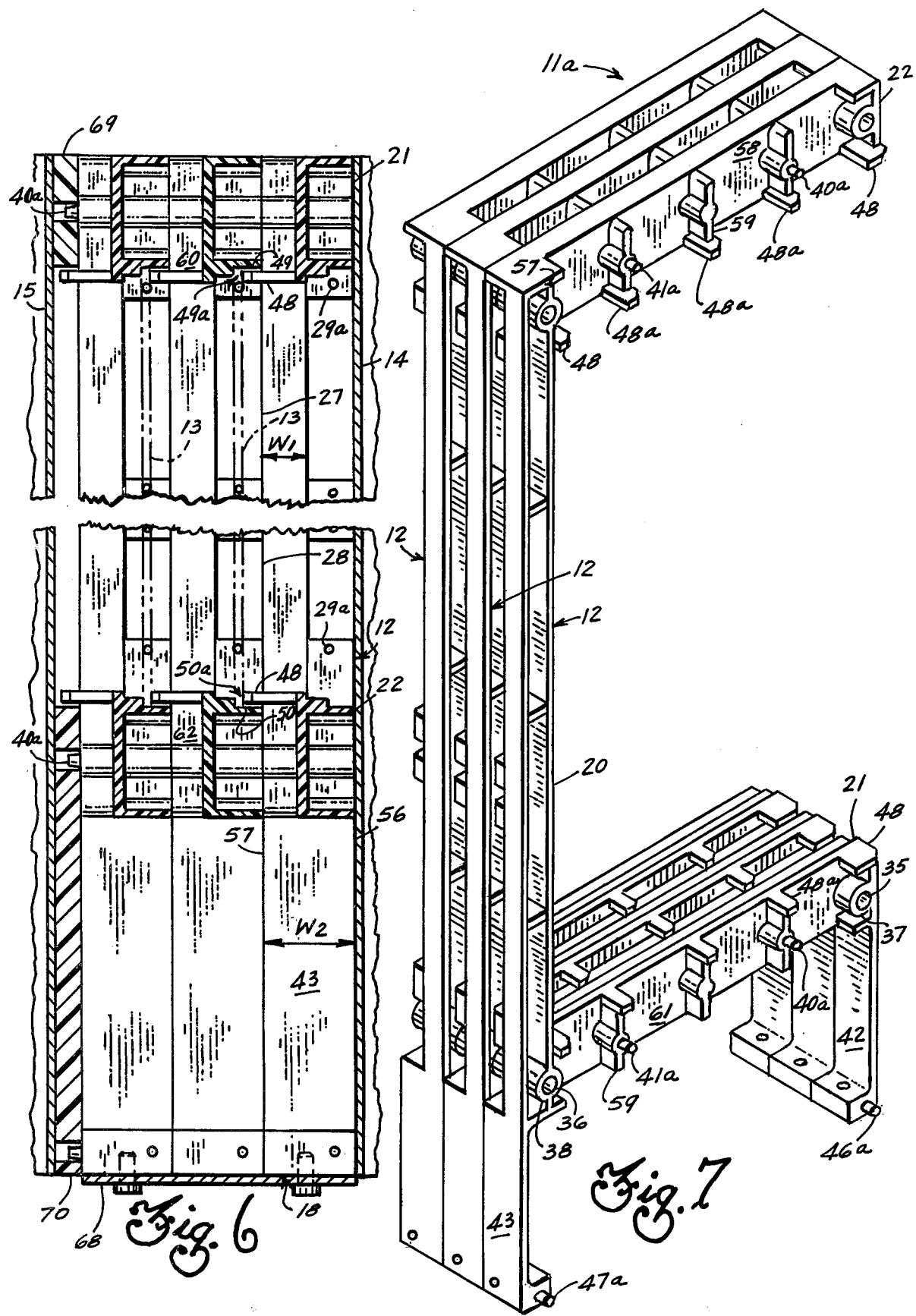

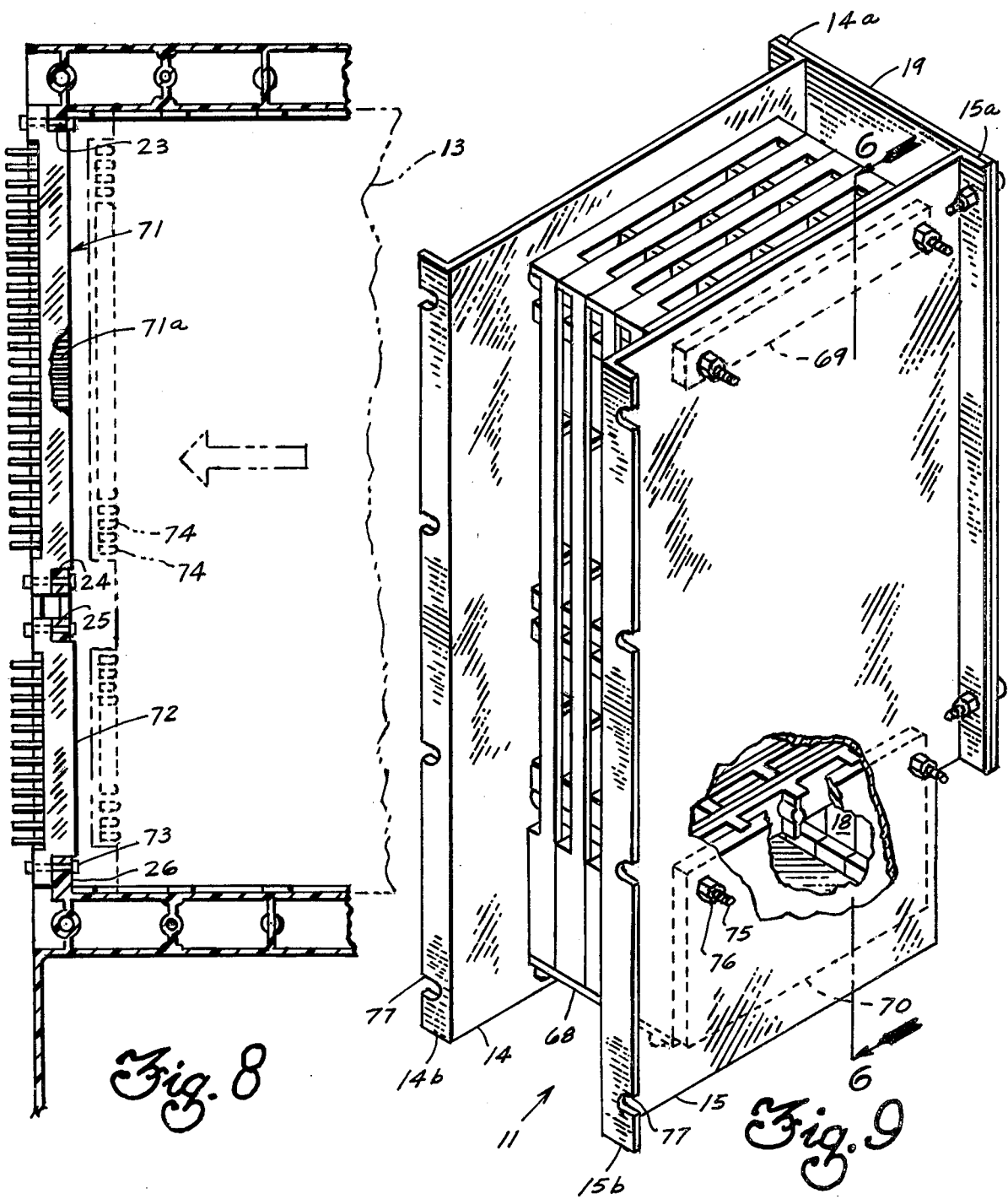

MODULAR CIRCUIT BOARD GUIDE

This is a continuation of application Ser. No. 261,591 filed May 7, 1981, now abandoned.

FIELD OF THE INVENTION

The invention generally relates to a support system for supporting and guiding printed circuit boards and for connecting the circuit boards into an electric assembly.

Background of the Invention

In electrical assemblies it is frequently the practice to utilize circuit boards or "cards" of thin, semi-rigid, sheets of fiber glass and the like upon which is carried electrical components interconnected by a network of surface-conducting tracks of circuitry. The circuit boards generally represent discrete circuit logic portions which may be isolated from other discrete elements in the entire electrical assembly. It is necessary to properly support the printed circuit boards in assembly, and to provide an interconnection with basic electric power sources and the like, and to control temperature of the electronic components in a convenient manner. Several key problems present themselves when dealing circuit board assemblies. first, the boards must be arranged so that unwanted heat generated in the electric assemblies is convected or otherwise carried away from the boards so as not to cause damage or unwanted electrical characteristics; secondly, the boards must be easily moved into and out the assembly without damage thereto by the technician and the boards must be easily connected to the basic machine or assembly wiring.

Heretofore, several prior art assemblies have sought to guide the circuit boards along a convenient edge, and provide that still another edge of the board may be engageable with commercial edge board connectors to interface printed circuit boards directly to hardwire field connections. One such prior art device is that of U.S. Pat. No. 4,091,440 which attempts to guide a printed circuit board by means of a central dovetail slide secured on one board surface wherein the slide is carried in one of a plurality of cooperating slideways in the support member. The slide has a plug at one end which is engageable in a support member socket to accomplish electrical interconnections. The support has, in turn, a set of plugs on the opposite end of its socket portion, to interface with a hardwire connection. The dovetail slide of the printed circuit board is fitted with a handle portion, so that the dovetail and board may be slidably withdrawn from the support member, at desired times. One drawback with this design is that the dovetail slide and mating slideway may be costly to form and control in manufacturing, and the dovetail/handle member must be fixably secured to the board, which may cause distortion of the board at assembly. Further, the boards are carried edge-to-edge, in the same plane, tending to increase the physical size of an assembly as the electronic logic becomes more complex. Another prior art card alignment device is illustrated in U.S. Pat. No. 4,092,699 wherein the principle structure comprises a metal frame or rack having parallel shelves comprising parallel formed channels, and the shelf channels are fitted with molded plastic split sleeves. The sleeves have closely-spaced transverse alignment slots. Each sleeve is comprised of two halves which are identical to one another fitted together with a snap-over action when clamped around the shelf channel. Thus, when the shelf channels are fitted with the respective split sleeves, and the sleeves are adjusted and locked in position, a printed circuit board may be edge-guided between upper and lower shelf channels by the respective transverse slots. A wired back plane is ordinarily secured behind each shelf to carry the receptors for the plated contacts on the printed circuit card. One inherent problem in this type of assembly is that the basic channel/shelf member must be predetermined to be of sufficient size to carry a maximum amount of cards, thus causing waste when only a small number of cards are desired to be used. Similarly, the channel sleeves, which are molded to finite length, may result in a waste of material when only several slots are utilized for card guiding. The spacing of the slots between upper and lower channel sleeves must be accurately determined so that twisting and deformation of the card will not result from the use of the independent sleeves which, typically, would comprise four to guide a rectangular printed circuit board: that is, two at the top and two at the bottom of the card (front and rear).

The difficulties inherent in the prior art devices have been obviated by the present invention which utilizes an easy to group and align array of modular molded assemblies, wherein parallel edge guide slots for a respective circuit board are accurately defined with respect to one another, and ease of electronic connection to an edge board connector may be readily accomplished. Further, the modular assembly defined provides for more closely controlled heat dissipation through defined convection channels and through a defined main air plenum on the assembly.

Summary of the Invention

A modular circuit board guide assembly is defined wherein a plurality of like modules, each of open-sided C-frame construction, include respective upper and lower limbs extending from a main body section, and guide tracks are formed in the upper and lower limbs to define a guide means for edge guiding a printed circuit board along a linear path. The main body section of the C-frame construction has associated therewith a respective edge board connector to interface the printed circuit board directly to hard wire field connections. The plurality of like modules are molded from a plastic material and are arranged for predetermined locations with respect to one another generally through the use of pins and sockets which are integral with the molded structure. Means is provided for securing the plurality of modules together, and a plurality of vent passages are formed across the upper and lower limbs of the respective modules, transverse to the guide tracks so as to provide for heat dissipation in a convection mode from the respective printed circuit boards.

In one preferred mode of the invention, a plenum chamber is formed on the respective lower limbs of said modules so that a chamber is formed when enclosed by a suitable plate element thereby permitting a central air source to direct cooling air into the plenum chamber, thereafter to be exited through the vent passages; across the lower limb, printed circuit board; and finally the upper limb of the C-frame section to dissipate heat in an efficient manner.

BRIEF DESCRIPTION OF THE DRAWINGS

FIG. 1 is a perspective environment view showing a bank of card guides of the present invention.

FIG. 2 is a perspective view illustrating three assembled units of the card guide of FIG. 1, as seen from the front right corner.

FIG. 6 is an elevational section view taken along the line 6—6 of FIG. 9.

FIG. 7 is a perspective view of three representative assembled card guide units taken from the rear left corner.

FIG. 8 is an elevational side section view taken along the line 8—8 of FIG. 1.

FIG. 9 is a rear left corner perspective view depicting end shielding plates.

DESCRIPTION OF THE PREFERRED EMBODIMENT

Figure 3:
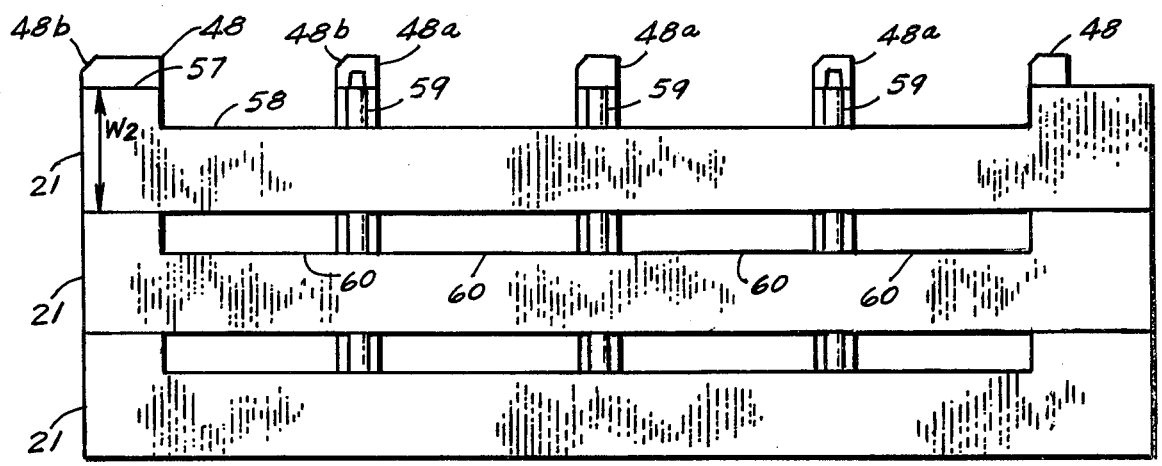
FIG. 3 is a top plan view taken in the direction of arrow 3 of FIG. 2.

Referring to the drawings, FIG. 1 depicts an electrical cabinet 10 enclosing therein a modular circuit board guide assembly 11 utilizing a sandwiched array of C-frame modules 12 to support and guide a plurality of printed circuit boards 13. The assembly 11 is faced on each end by end closure plates 14,15, which serve the additional purposes of supporting adjacent electrical assemblies and enclosing a plenum chamber 18 at the bottommost portion of the assembly 11, which will be discussed more fully when considering FIG. 2. The end plates 14,15 also serve to mount the entire electrical assembly 11 to the cabinet 10. A front cover plate 19 is mounted to the end closure plates 14,15, but has been removed for clarity.

The perspective view of FIG. 2 clearly illustrates the structure of the individual guide module 12 and the interrelationship of the modules 12 in a partial assembly 11a. The guide module 12 is preferably molded of one-piece, substantially rigid plastic material, and is basically an open sided squared C-frame structure having a main body section 20 and upper and lower limb sections 21,22 extending from the main body section 20. While many materials well-known in the plastic arts may be suitable for manufacturing the guide module, styrene acrylonitrile has been found to be an excellent material, which, when filled with finely-milled glass reinforcement, is of sufficient rigidity, having low creep (dimensional stability) and fire retardant properties. This thermoplastic material is well-suited to injection molding. If a thermosetting material is substituted, different molds could be used for compression molding of the module. The foregoing information is given by way of example, and not limitation, since the designer may, of course, select various materials and manufacturing techniques to achieve desired properties.

The main body section 20 is of thinner width "W1", than that of the upper and lower limbs "W2", but has upper and lower pairs of spaced-apart lugs 23,24 and 25,26 extending sidewise from the main body section 20 to the full width "W2", of the limbs 21,22. In assembly, the spaced-apart lug pairs 23,24 and 25,26 define apertures 27,28 from the rear to the front walls 29,30 of the main body section 20 which are fitted with commercial edge board connectors (not shown). The lugs 23,24 and 25,26 are provided with holes 29a for securing the edge board connectors in place. Here it may be noted that the spaced-apart lugs provide for separated edge board connectors utilized in the present assembly for handling differing levels of signal to different parts of the circuit board. However, the selection of edge board connectors is within the discretion of the designer as to the size and quantity of connectors to be provided on the main body section. The lower limb 22 is of generally hollowed-out construction, having upper and lower parallel wall sections 31,32 extending from the front 33 to the rear 34 of the limb 22. A pair of parallel bores 35,36 are provided transversely through bosses 37,38 at the frontmost and rearmost portions of the limb 22 through which may pass a respective tie rod (not shown) to secure a plurality of modules together. Each boss 37,38 has a thin wall and web section connecting it to the upper and lower wall sections 31,32 of the hollowed-out limb 22, so that material sections may be maintained for purposes of cooling and dimensional control when forming, and further for purposes of maximizing strength while saving material. Midway from the front to rear, a central web 39 is provided to connect the upper and lower wall sections 31,32 together. Front and rear aligning sockets 40,41 are provided within the limb 22 equally spaced about the central web 39, and each socket 40,41 is formed in a boss which is tied to the upper and lower wall sections 31,32 by web portions. The aligning socket is provided so that adjacent modules may be accurately registered with respect to one another by engagement with suitable alignment pins 40a,41a (see FIG. 5) on the opposite side of the module. The front 33 and rear 34 of the lower limb 22 are provided with integral downwardly-extending walls 42,43 which terminate at bottom lugs 44,45. The walls 42,43 define a plenum chamber 18 when enclosed, which will be discussed further in conjunction with FIG. 6. The bottom lugs 44,45 are also provided with side sockets 46,47 to receive companion aligning pins from an adjacent module.

The upper and lower limbs 21,22 have sidewise-extending tabs 48 beyond the width W2, which fit closely into an adjacent groove portion 49,50 of an adjacent module 12, wherein the sides 51,52 of the groove portions 49,50 and the respective ends 53 of the tabs 48 define a controlled-width slot, 49a,50a or guide track, for receiving a printed circuit board. In the module 12 defined here, the sides 51,52 of the groove portions 49,50 have a slight relief 54,55 extending along their lengths, to provide clearance for electronic assemblies of the printed circuit board, but, it may be appreciated that modification of the groove portions 49,50 may be accomplished to suit any printed circuit board which may be employed. The sides 51,52 of the upper and lower groove portions 49,50 are molded in the module 12 at a common plane, parallel to the sides 56,57 of the module so that the array of printed circuit boards may be held in parallel relationship to one another.

The upper plan view of FIG. 3, further illustrates the tabs 48 extending from the side 57 of the upper limb 21. The leading corner 48b of each tab 48 of the limb 21 is chamfered or rounded so that a printed circuit board will not hang-up when inserted. The tabs 48 extend from a point outside the furthermost width W2 of the limb 21, and the innermost tabs 48a are tied to a relief portion 58 in the side of the limb 21 by a stiffening rib 59, so that clamped modules 12 will define transverse vent passages 60 across the limb 21, thus providing a conduit for thermal ventilation.

Figure 4:
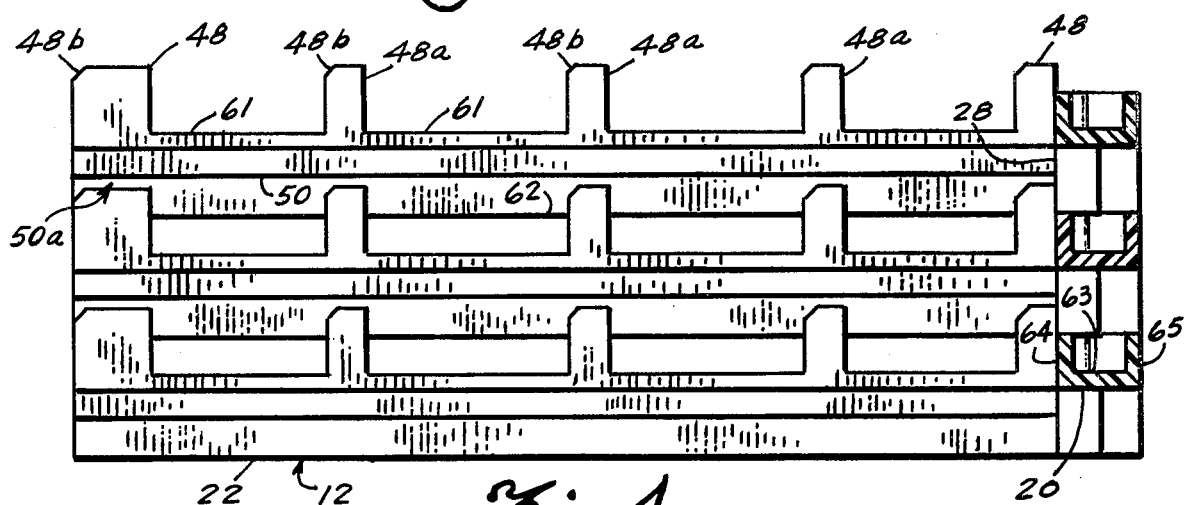
FIG. 4 is a plan sectional view taken along the line 4—4 of FIG. 2.

The section depicted in FIG. 4, illustrates the tabs 48 at the lower limb 22, and their relationship to the groove portion 50 of the adjacent modules 12, thus defining the slot 50a for guiding the printed circuit board. The tabs 48 of the lower limb 22, are similarly chamfered at their leading edge 48b, to provide smooth board entry, and the innermost lower tabs 48a extend to a relief portion 61 in the side 57 of the lower limb 22 to define transverse vent passages 62 as a conduit for thermal convection. The main body section 20 of the modules 12 is hollowed out by means of a lightening groove 63, to establish front and rear sidewalls 64,65 of the section 20. The apertures 28 established between the main body sections 20 of adjacent modules 12, is central with the guide slot 50a defined for guiding the printed circuit board, so that the circuit board may be easily plugged into an edge board connector (not shown) which will be located in the respective aperture 28. Similarly, the upper aperture 27 (see FIG. 2) is central with the upper guide slot 49a.

Figure 5:
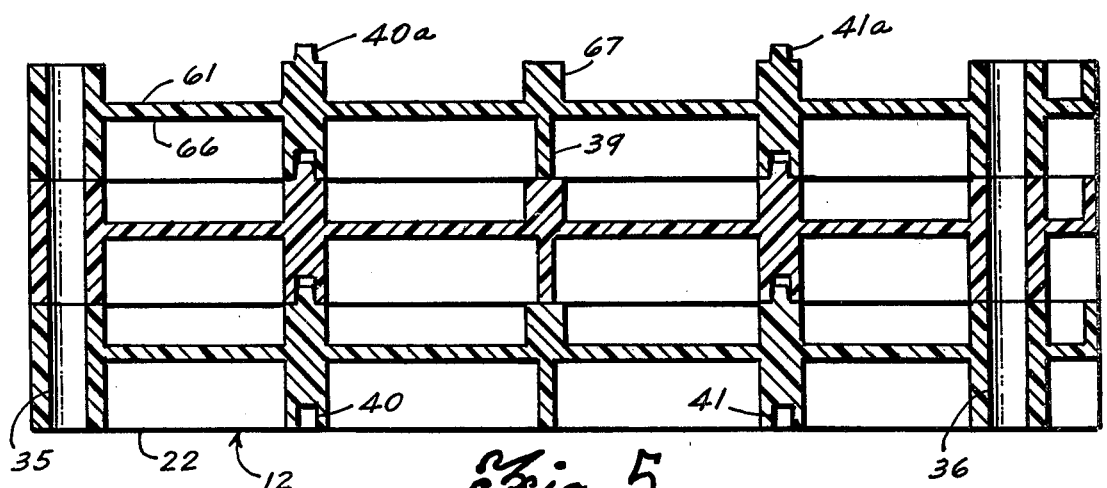
FIG. 5 is a plan sectional view taken along the lines 5—5 of FIG. 2 illustrating respective module alignment means.

The section of FIG. 5, taken through the lower limbs 22 of adjacent modules 12, depicts the molded structures, with their adjacent alignment pins 40a,41a and bores 40,41 engaged, and the tie bolt bores 35,36 aligned for reception of a suitable tie rod (not shown). Here, it will be noted that the inner surface 66 of the lower limb 22 (as well as that of the upper limb 21) defines a wall at the vent relief portion 61 to provide stiffness to the assembly. Midway along the length of the lower limb 22 and upper limb 21, a spacer boss 67, oppositely disposed to the central web 39, is provided to maintain the rigidity of the structures 12 when bolted together.

The vertical section of FIG. 6 illustrates a cut-away portion through the upper and lower limbs 21,22, to more clearly show the relationship of adjacent modules 12. Here, the alignment pins 41a are shown integral with the upper and lower limbs 21,22 which are engageable with mating modules 12, and the apertures 27,28 at the main body sections 20 are shown with suitable fastener holes 29a for securing an edge board connector (not shown) to the main body section 20. A printed circuit board 13 (shown in phantom) is illustrated as being located centrally within the apertures 27,28 of the main body section 20 and the board 13 is guided in the slots 49a,50a formed by the edge groove portions 49,50 of one side 56 of a module 12 and the side tabs 48 of the oppositely-disposed side 57 of an adjacent module 12. The downwardly-extending wall 43 of the lower limb 22 serves to define a plenum chamber 18, wherein a cooling medium such as air may be directed by any suitable means, once the plenum 18 is enclosed by a lower plate 68 and side plates 14,15. The left side plate 15 is spaced out by upper and lower filler blocks 69,70, so the plate 15 will not rest on the relatively fragile tabs 48 of the last module 12 of the assembly.

The cooling medium may be directed into the plenum 18 by several ways, for example: a motor powered cooling fan may be mounted directly to one of the plates 14,15,68, at a suitable opening provided therein; or, cooling medium may be directed to the plenum by a hose connected at one end to an opening in one of the plates 14,15,68, and at the other end connected to a cooling source remote from the plenum 18. The air is thereby commonly directly through the plenum 18 first to the respective lower limbs 22 and lower limb vent passages 62, so that the wash of cooling convections may be directed up through the assembly, across the circuit boards 13, and out through the vent passages 60 of the upper limbs 21, to cool the electronic assembly. As an alternative to the forced-air convection system described, the lower plate 68 may be omitted from some assemblies where natural convection through the vent passages 60,62 will suffice.

The perspective view of FIG. 7 illustrates the opposite sides of the modules 12 and assembly 11a as that shown in FIG. 2, wherein the side 57 of the main body section 20 is depicted as a hollowed-out ribbed structure, and the side of the upper and lower limbs 21,22 are depicted with their slot-forming tabs 48 extending therefrom. The innermost tabs 48a are tied to the relief portions 58,61 by ribs 59, and several of the ribs 59 are provided with alignment pins 40a,41a extending toward cooperating sockets of an adjacent module 12. The tie rod bores 35,36 and bosses 37,38 extend in line with the bosses of the opposite side. The downwardly extending side walls 42,43 of the plenum 18 of the module 12 are fitted with side alignment pins 46a,47a to fit in cooperating bores 46,47 in the next module 12, as well.

Turning to FIG. 8, the side elevational section depicts upper and lower edge board connectors 71,72 of a common commercial variety which are secured respectively to the upper and lower pairs of lugs 23,24 and 25,26 of the main body section 20 by suitable fasteners 73. A typical printed circuit board 13 (shown in phantom) is slid in the direction of the arrow so that its edge terminals 74 may be received in the springy clamp fingers 71a of the edge board connector 71,72 to accomplish an electrical interface and mechanical retention in a manner well-known in the art.

The perspective view of FIG. 9, taken in a direction as that of FIG. 7, illustrates that the module assembly 11 is terminated with suitable side plates 14,15, and completely fastened into an integral structure by tie rods 75 and nuts 76 extending through the assembly 11. The front edges of the side plates 14,15 are bent to create a flange 14a,15a and a front plate 19 is secured to the flanges 14a,15a to assist in creating a chimney for the convection air, and to prevent unauthorized access to the front entry portion of the printed circuit boards 13. When it is desirable to extract the printed circuit boards 13, the front plate 19 is removed first. The rearwardly extending portions of the side plates 14,15 are bent into flanges 14b,15b with suitable apertures 77 for receiving fasteners which may secure the assembly into an electronic cabinet. The lower plate 68 encloses the plenum 18. The last module 12 is fitted with upper and lower filler blocks 69,70 of suitable spacer material to provide a flat clamping surface for the side plate 15.

While the foregoing description is shown in the connection with the preferred embodiment, it is not intended that the invention be limited to the description provided, rather, the invention extends to all such modifications and designs as come within the scope of the appended claims.

What is claimed is:
1. A modular circuit board guide assembly, comprising:
 (a) a plurality of identical molded plastic modules, each having a one-piece generally C-frame construction including respective upper and lower limbs extending from a main body section;
 (b) guide means for a single circuit board formed by and between said upper and lower limbs of cooperating side-by-side modules, said guide means comprising a slot having two sides, one side formed by one module and the other side formed by the other module;
(c) a circuit board connector mounted to said main body section of at least one of said modules;
(d) fastener means for securing said plurality of modules together in seriatem;
(e) registering means for locating said plurality of modules in a predetermined orientation with respect to one another;
(f) a plenum chamber integrally formed on the respective lower limbs of said modules and enclosed with suitable cover plates; and
(g) a vent passage formed across each of said upper and lower limbs, transversely through said slot, said lower limb vent passage in vent communication with said plenum chamber.

2. A modular circuit board guide assembly, comprising:
(a) a plurality of like modules, each having a generally C-frame construction including respective upper and lower limbs extending from a main body section;
(b) guide means for a single circuit board formed by and between cooperating side-by-side modules, said guide means comprising a slot having two sides, one side formed by one module and the other side formed by the other module;
(c) circuit board connector means mounted in a fixed position in relation to said main body section; and
(d) means for securing said plurality of modules together in seriatem.

3. The modular guide assembly of claim 2, further including vent means in one of said lower limbs, transverse to said guide means.

4. The modular guide assembly of claim 2, further including a vent passage in each of said upper and lower limbs, transverse to said guide means.

5. The modular guide assembly of claim 4, further including an enclosed convection plenum in communication with said vent passage.

* * * * *